United States Patent
Cho et al.

(10) Patent No.: US 7,936,612 B2
(45) Date of Patent: May 3, 2011

(54) PHASE CHANGE MEMORY DEVICE GENERATING PROGRAM CURRENT AND METHOD THEREOF

(75) Inventors: Beak-Hyung Cho, Hwaseong-si (KR); Woo-Yeong Cho, Suwon-si (KR); Mu-Hui Park, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,338

(22) Filed: Dec. 17, 2009

(65) Prior Publication Data
US 2010/0110781 A1   May 6, 2010

Related U.S. Application Data

(62) Division of application No. 11/898,045, filed on Sep. 7, 2007, now Pat. No. 7,656,719.

(30) Foreign Application Priority Data

Sep. 8, 2006  (KR) .......................... 10-2006-0086968

(51) Int. Cl.
*G11C 7/10* (2006.01)
(52) U.S. Cl. ................... 365/189.05; 365/163; 365/148; 365/192; 365/189.09
(58) Field of Classification Search .................... 365/46, 365/94, 100, 113, 148, 163, 192, 189.05, 365/189.09; 257/2–5, 296, E31.047, E27.006; 438/29, 95, 96, 166, 365, 482, 486, 597
See application file for complete search history.

(56) References Cited

U.S. PATENT DOCUMENTS

| | | | |
|---|---|---|---|
| 2004/0027907 | A1 * | 2/2004 | Ooishi .......................... 365/226 |
| 2005/0141261 | A1 | 6/2005 | Ahn |
| 2005/0195633 | A1 | 9/2005 | Choi et al. |
| 2006/0087876 | A1 | 4/2006 | Cho et al. |

FOREIGN PATENT DOCUMENTS

| | | |
|---|---|---|
| KR | 10-2004-0007112 | 2/2004 |
| KR | 10-2005-0070700 | 7/2005 |
| KR | 10-2005-0089500 | 9/2005 |
| KR | 10-0564636 | 3/2006 |

\* cited by examiner

*Primary Examiner* — Richard Elms
*Assistant Examiner* — Harry W Byrne
(74) *Attorney, Agent, or Firm* — Harness, Dickey & Pierce

(57) ABSTRACT

A phase change memory device may include a memory cell array, a write driver, and/or a control unit. The memory cell array may include a plurality of memory cells. The write driver may be configured to provide a program current to the memory cell array for setting a state of a phase change material to program a selected memory cell. The write driver may be configured to provide the program current such that the program current has a plurality of steps. The control unit may be configured to receive step information for adjusting a magnitude and a width of each step of the program current during a test operation and provide the step information to the write driver during a normal operation.

16 Claims, 9 Drawing Sheets

PHASE CHANGE MEMORY DEVICE GENERATING PROGRAM CURRENT AND METHOD THEREOF

CROSS REFERENCE TO RELATED APPLICATIONS

This is a divisional of U.S. application Ser. No. 11/898,045 filed Sep. 7, 2007, now U.S. Pat. No. 7,656,719; the contents of which are hereby incorporated by reference in their entirety. This U.S. non-provisional patent application claims the benefit of priority under 35 U.S.C §119 to Korean Patent Application 10-2006-0086968 filed on Sep. 8, 2006, the entire contents of which are incorporated herein in their entirety by reference.

BACKGROUND

1. Field

Example embodiments relate to a semiconductor memory device and/or a method thereof, for example, to a phase change memory device configured to generate a program current and/or a method thereof.

2. Description of Related Art

Conventional semiconductor memory devices are storage devices that store data and read out the stored data if needed. Conventional semiconductor memory devices may be roughly classified into RAM and ROM. RAM is configured to read and write data with less limitation, but data stored therein disappears at power-off. Examples of RAM include DRAM, SRAM, and so on. ROM is configured so that stored data is not deleted at power-off, but ROM may have more limitations than RAM. Examples of ROM include PROM, EPROM, EEPROM, flash memories, and so on. A flash memory is mainly divided into a NOR flash memory device and a NAND flash memory device.

Conventional semiconductor memory devices may use non-volatile materials instead of capacitors in DRAM. Examples of conventional semiconductor memory devices using non-volatile materials instead of capacitors include ferroelectric RAM (FRAM), magnetic RAM (MRAM) using tunneling magneto-resistive (TMR) films, phase change memory devices using chalcogenide alloys, and the like. In particular, a phase change memory device is a non-volatile memory device using phase change, for example, resistance change according to a temperature variation. A phase change memory device may have a simpler fabrication process. Accordingly, a memory with a larger capacity may be realized with a lower cost.

FIG. 1 shows a memory cell of a conventional phase change memory device.

Referring to FIG. 1, a memory cell 10 may include a memory element 11 and a select element 12. The memory element 11 is connected between a bit line BL and the select element 12, and the select element 12 is connected between the memory element 11 and a ground.

The memory element 11 may include a phase change material GST, which is a resistance element, for example, Ge—Sb—Te. A resistance of the phase change material GST is varied according to temperature. The phase change material GST may have either one of two stable states, i.e., a crystal or crystalline state and an amorphous state. The phase change material GST may change into a crystalline state or an amorphous state according to a current supplied via the bit line BL. A phase change memory device may program data using the characteristics of the phase change material GST.

The select element 12 may include an NMOS transistor NT. A gate of the NMOS transistor is connected to a word line WL. If a voltage is applied to the word line WL, the NMOS transistor NT is turned on. As the NMOS transistor NT is turned on, the memory element 11 is supplied with a current via the bit line BL. In FIG. 1, the memory element 11 is connected between the bit line BL and the select element 12. However, the select element 12 may be connected between the bit line BL and the memory element 11.

FIG. 2 shows another memory cell of a conventional phase change memory device.

Referring to FIG. 2, a memory cell 20 may include a memory element 21 and a select element 22. The memory element 21 is connected between a bit line BL and the select element 22, and the select element 22 is connected between the memory element 21 and a ground. The memory element 21 is identical to the memory element 11 in FIG. 1.

The select element 22 may consist of a diode D. The memory element 21 is connected to an anode of the diode, and a word line WL is connected to its cathode. If a voltage difference between the anode and the cathode of the diode D becomes higher than a threshold voltage of the diode D, the diode D is turned on. Accordingly, a current may be supplied to the memory element via the bit line BL.

FIG. 3 is an example graph for describing characteristics of a conventional phase change material GST illustrated in FIGS. 1 and 2. In FIG. 3, a reference numeral 1 indicates a condition where a phase change material GST changes to an amorphous state, and a reference numeral 2 indicates a condition where a phase change material GST changes to a crystalline state.

Referring to FIG. 3, a phase change material GST may be set to an amorphous state by heating at a temperature higher than melting temperature Tm during a time period T1 by supplying a current and quenching. The amorphous state is called "a reset state" and corresponds to data '1'. Alternatively, the phase change material may be set to a crystalline state by heating at a temperature lower than the melting temperature Tm and higher than crystallization temperature Tc during a time period T2 longer than the time period T1 and slowly cooling down. The crystalline state is called "a set state" and corresponds to data '0'. Accordingly, a memory cell may have a resistance that is varied according to an amorphous volume of a phase change material.

A conventional phase change memory device may include a write driver circuit that is configured to supply a phase change material with a program current at a program operation. The write driver circuit may be configured to supply a memory cell with a program current, i.e., a set current or a reset current using an external power supply voltage (e.g., a power supply voltage higher than 2.5V). The set current is a current used to set a phase change material of a memory cell to a set state, and the reset current is a current used to set a phase change material of a memory cell to a reset state.

A conventional set current may have a waveform (hereinafter, referred to as a pulse waveform) having a constant magnitude during a given time and a waveform (hereinafter, referred to as a step down waveform) whose magnitude is stepped down by a given magnitude.

A set current having a conventional step down pulse may have a waveform that is decreased in steps and the step magnitude and width are fixed. Because the step magnitude and width are fixed, a waveform of a set current can not be changed. Accordingly, the set resistance distribution of a phase change material can not be adjusted.

SUMMARY

According to an example embodiment, a phase change memory device may include a memory cell array, a write driver, and/or a control unit. The memory cell array may include a plurality of memory cells. The write driver may be configured to provide a program current to the memory cell array for setting a state of a phase change material to program a selected memory cell. The write driver may be configured to provide the program current such that the program current has a plurality of steps. The control unit may be configured to receive step information for adjusting a magnitude and a width of each step of the program current during a test operation and provide the step information to the write driver during a normal operation.

According to an example embodiment, a phase change memory device may include a memory cell array, a write driver, a data buffer, a step storing circuit, and/or a step control circuit. The memory cell array may include a plurality of memory cells. The write driver may be configured to provide a program current to the memory cell array for setting a state of a phase change material to program a selected memory cell. The write driver may be configured to provide the program current such that the program current has a plurality of steps. The data buffer may be configured to receive external data and provide the external data to the write driver during a normal operation. The step storing circuit may be configured to store the step information for adjusting the magnitude and the width of each step of the program current during the test operation. The step control circuit may be configured to receive the magnitude and width information of each step from the step storing circuit and provide the received magnitude and width information of each step to the write driver during the normal operation.

According to an example embodiment, a method of generating a program current may include storing step information for adjusting a magnitude and width of each step of a plurality of steps of a program current during a test operation, the program current for setting a state of a phase change material to program a selected memory cell. The magnitude and width information of each step of the program current may be provided to a write driver during a normal operation. Each step of the program current may be adjusted based on the magnitude and width information corresponding to each step of the program current.

DETAILED DESCRIPTION OF EXAMPLE EMBODIMENTS

Figure 1:
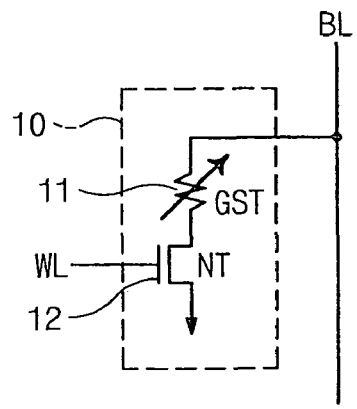
FIG. 1 shows a memory cell of a conventional phase change memory device.

Example embodiments will now be described more fully hereinafter with reference to the accompanying drawings. Embodiments may, however, be in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 4:
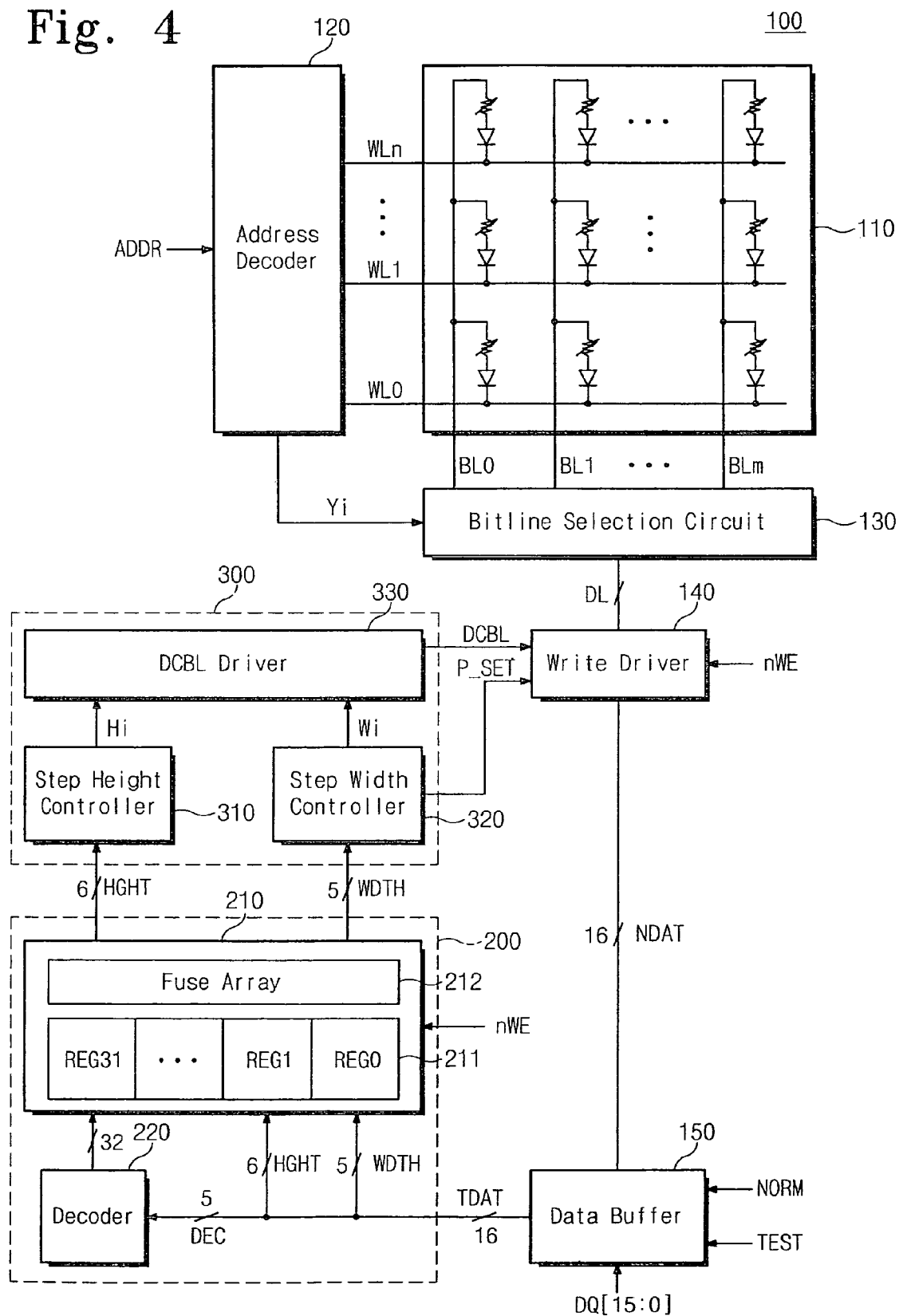
FIG. 4 is a block diagram showing a phase change memory device according to example embodiments.

FIG. 4 is a block diagram showing a phase change memory device according to an example embodiment. Referring to FIG. 4, a phase change memory device 100 may include a memory cell array 110, an address decoder 120, a bit line selection circuit 130, a write driver 140, a data buffer 150, and/or a control unit 400. The control unit 400 may include a step storage circuit 200 and/or a step control circuit 300.

The memory cell array 110 may include a plurality of memory cells, each of which has a memory element and a select element. The memory element may include a phase change material GST, and the select element may include an NMOS transistor (e.g., refer to FIG. 1, NT) or a diode (e.g., refer to FIG. 2, D).

The address decoder 120 may be connected to the memory cell array 110 via word lines WL0 to WLn. The address decoder 120 may decode an externally applied address ADDR and provide a bias voltage to a selected word line of the word lines WL0 to WLn. The address decoder 120 may generate a select signal Yi for selecting bit lines BL0 to BLm, and may supply the select signal Yi to the bit line selection circuit 130.

The bit line selection circuit 130 may be connected to the memory cell array 110 via the bit lines BL0 to BLm. The bit line selection circuit 130 may select bit lines in response to the selection signal Yi from the address decoder 120. The bit line selection circuit 130 may include a plurality of NMOS transistors (not shown). The NMOS transistors may be configured to connect selected bit lines of the bit lines BL0 to BLm and data lines DL in response to the selection signal Yi.

Figure 2:
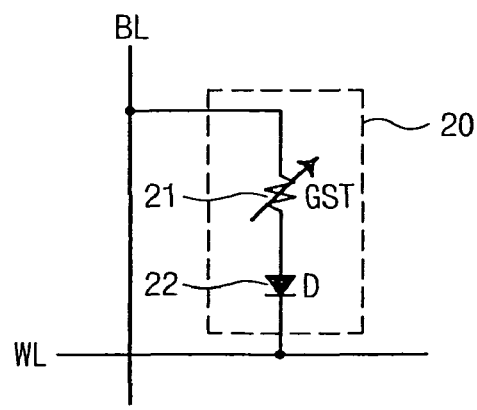
FIG. 2 shows another memory cell of a conventional phase change memory device.
Figure 3:
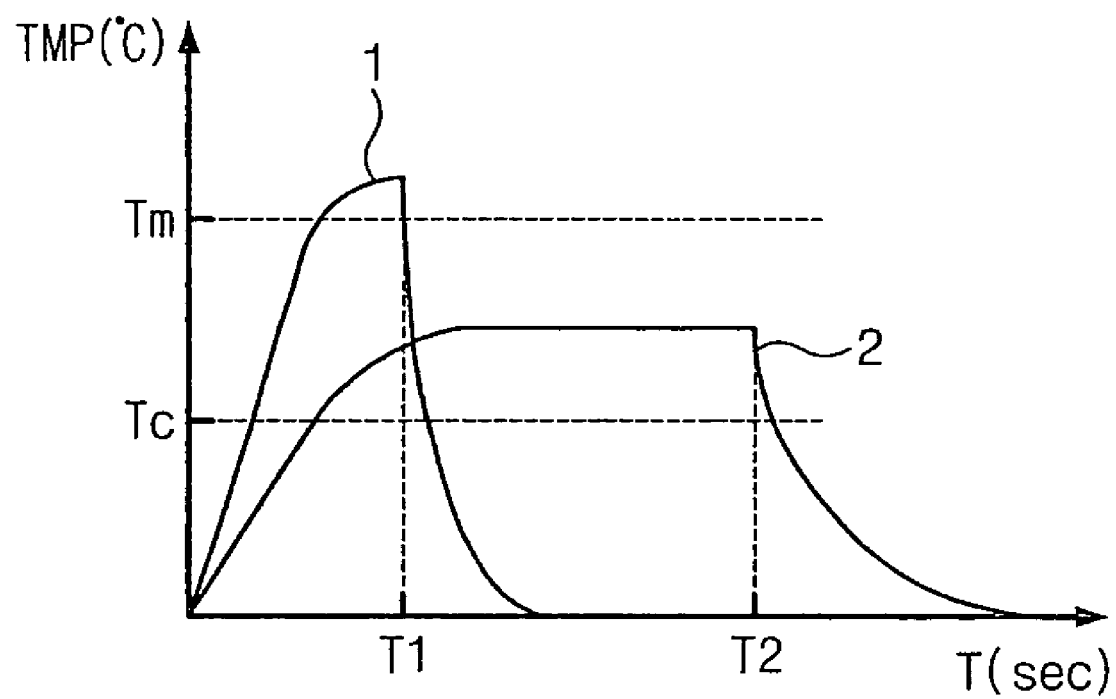
FIG. 3 is a graph for describing characteristics of a phase change material included in the conventional phase change memory devices of FIGS. 1 and 2.

The write driver 140 may receive a program pulse P_PGM, a voltage DCBL, and data NDAT and/or provide a program current I_PGM to data lines DL in synchronization with a write enable signal nWE. The program pulse P_PGM may include a set pulse P_SET and a reset pulse P_RST. The set pulse P_SET is illustrated in FIGS. 1 and 4, but the reset pulse P_RST may instead be supplied to the write driver 140 at a program operation.

The program current I_PGM may include a set current I_SET and a reset current I_RST. If data '0' is received, the write driver 140 may provide the set current I_SET in response to the set pulse P_SET. If data '1' is received, the write driver 140 may provide the reset current I_RST in response to the reset pulse P_RST.

Figure 9:
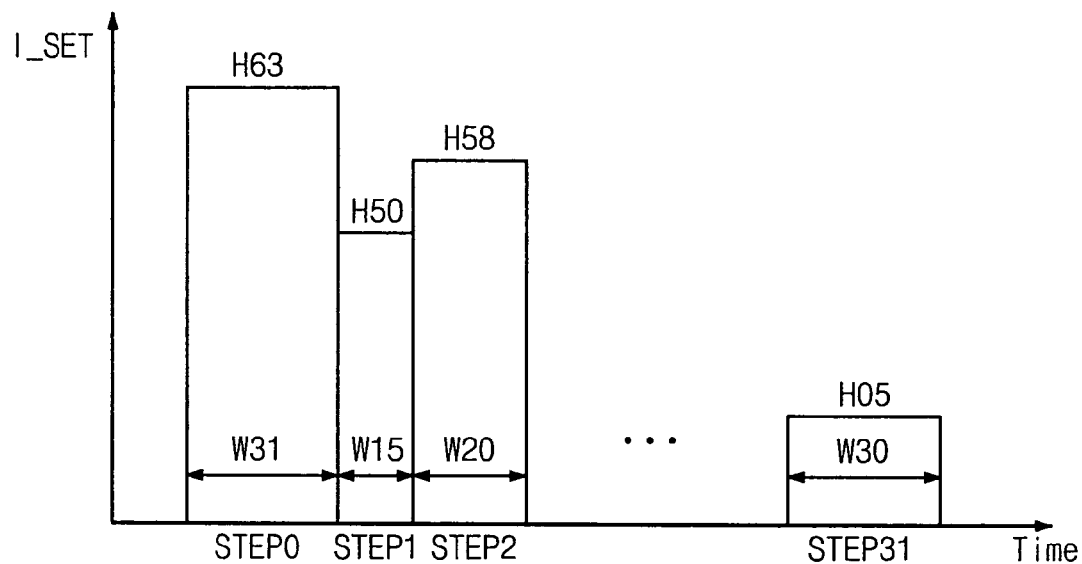
FIG. 9 is an example graph showing a step set current generating method of a phase change memory device illustrated in FIG. 4.

The write driver 140 may generate a step set current. The step set current may be a set current consisting of a plurality of steps, e.g., as illustrated in FIG. 9. Accordingly, the phase change memory device 100 according to example embodiments may be configured to vary the magnitude and width of the respective steps of the step set current so that a waveform of a required step set current is achieved.

The data buffer 150 may receive external data and provide normal data NDAT to the write driver 140 in response to a normal mode signal NORM during a normal operation. The data buffer 150 may be connected to data pads DQ. The number of the data pads may be a desired number, or alternatively, a number determined based on a phase change memory device. Hereinafter, it will be assumed that a phase change memory device has 16 data pads DQ[15:0], however, example embodiments are not limited thereto.

The data buffer 150 may provide test data TDAT to the step storage circuit 200 in response to a test mode signal TEST during a test operation. The test operation may be to create an improved set current waveform and may be carried out prior to a normal operation. The phase change memory device according to example embodiments may determine the magnitude and width of each step of the step set current during the test operation, and may create the improved set current during the normal operation. The test operation or the normal operation may be controlled by a mode register set MRS.

The step storage circuit 200 may store information (hereinafter, referred to as step information) with respect to the magnitude and width of each step of the step set current. During the normal operation, the step control circuit 300 may receive the step information from the step storage circuit 200 and provide the step information to the write driver 140.

Continuing to refer to FIG. 4, the step storage circuit 200 may include a storage 210 and/or a decoder 220. The step storage circuit 200 may receive the test data TDAT via the data buffer 150. The test data TDAT may include the step information. The test data TDAT may include decode data DEC, step magnitude data HGHT, and/or step width data WDTH. FIG. 4 illustrates 16-bit test data TDAT that includes 5-bit decode data DEC, 6-bit step magnitude data HGHT, and 5-bit step width data WDTH, however, example embodiments are not limited thereto and the test data TDAT may include any number of bits. The 16-bit test data TDAT may be received 32 times in synchronization with the write enable signal nWE.

The storage 210 may include a register array 211, which has a plurality of registers REG0 to REG31. Each of the registers REG0 to REG31 may store step magnitude data and step width data. For example, the register REG0 may store step magnitude data HGHT and step width data WDTH for first input test data (D0, e.g., refer to FIG. 7) in response to a first transition of the write enable signal nWE. For example, 11-bit step information may be stored in the register REG0. The step information may determine step magnitude and step width of a step STEP0 (e.g., refer to FIG. 9) during a normal operation. Similarly, the register REG31 may store step information of a step STEP31. A waveform of a step set current may be determined according to step information stored in the register array 211.

The phase change memory device 100 according to example embodiments may provide a set current having various waveforms to a memory cell. Accordingly, an improved set current waveform configured to narrow a set current distribution and/or improve sensing margin may be formed.

The storage 210 may include a fuse array 212. As described above, the register array 211 may store step information with respect to respective steps STEP0 to STEP31 during a test operation. However, step information in the register array 211 may be lost at power-off. The fuse array 212 may retain the step information at power-off. The storage 210 may use a memory circuit (e.g., non-volatile memory cells), which may store step information, instead of the fuse array 211. A structure of the storage 210 will be described later with reference to FIG. 6.

The decoder 220 may receive the 5-bit decode data DEC and select one of the plurality of registers REG0 to REG31. A structure and operation of the decoder 220 are well known to one skilled in the art and a description thereof is thus omitted. An operation, in which step information may be stored in the step storage circuit 200 during the test operation, will be described later with reference to FIG. 7.

The step control circuit 300 may include a step magnitude controller 310, a step width controller 320, and/or a DCBL driver 330. The step control circuit 300 may control the write driver 140 in response to the step information from the step storage circuit 200.

The step magnitude controller 310 may be configured to generate step magnitude control signals Hi (i=0 to 31) in response to step magnitude data HGHT stored in the step storage circuit 200. For example, in case of STEP0, the step magnitude controller 310 may generate a step magnitude control signal H0 in response to the step magnitude data HGHT stored in a register REG0.

The step width controller 320 may generate step width control signals Wi in response to step width data WDTH. For example, in the case of STEP0, the step width controller 320 may generate a step width control signal W0 in response to step width data WDTH stored in a register R0. Meanwhile, the step width controller 320 may generate the set pulse P_SET and supply the set pulse P_SET to the write driver 140. The set pulse P_SET may be activated within all step intervals STEP0 to STEP31.

The DCBL driver 330 may generate the DCBL voltage DCBL in response to the step magnitude control signals Hi and the step width control signals Wi. The DCBL voltage may be an analog signal and/or may be supplied to the write driver 140. The write driver 140 may determine step magnitude and width of a step set current using the DCBL voltage.

As set forth above, the phase change memory device 100 according to example embodiments may be configured to adjust step magnitude and width of a step set current through the step storage circuit 200 and the step control circuit 300. Example embodiments may create an improved set current waveform while changing a waveform of a set current. Accordingly, a set resistance distribution may be narrowed and/or sensing margin may be improved.

Figure 5:
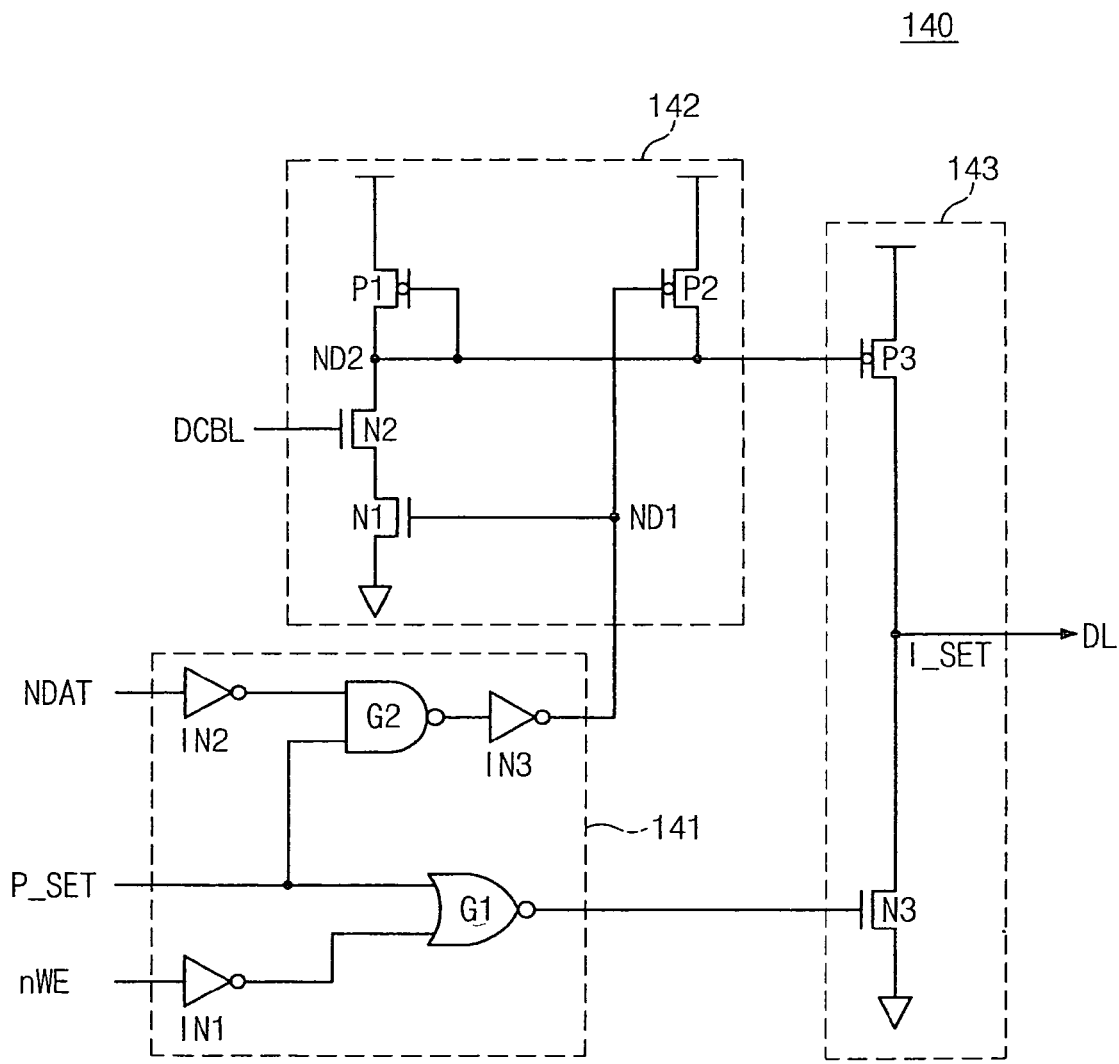
FIG. 5 is a circuit diagram showing a write driver illustrated in FIG. 4.

FIG. 5 is a circuit diagram showing a write driver illustrated in FIG. 4.

Referring to FIG. 5, a write driver 140 may include a set pulse input circuit 141, a control circuit 142, and/or a set current driving circuit 143. The set pulse input circuit 141 may include three inverters IN1 to IN3, a NOR gate G1, and/or a NAND gate G2. The control circuit 142 may include two NMOS transistors N1 and N2 and/or two PMOS transistors P1 and P2. The set current driving circuit 143 may include an NMOS transistor N3 and/or a PMOS transistor P3.

A gate of NMOS transistor N2 of the control circuit 142 may receive the DCBL voltage. A source of the PMOS transistor P1 may be connected to a power supply voltage and a drain of the PMOS transistor P1 may be connected to a drain of the NMOS transistor N2. A gate of the PMOS transistor P1 may be connected to the drain of the PMOS transistor P1 to form a node ND2. A source of the NMOS transistor N1 may be connected to the ground and a gate of the NMOS transistor N1 may be connected to a gate of the PMOS transistor P2 to form a node ND1. A source of the PMOS transistor P2 may be connected to the power supply voltage and a drain of the PMOS transistor P2 may be connected to the node ND2.

A gate of the PMOS transistor P3 of the set current driving circuit 143 may be connected to the node ND2, and/or a source and drain of the PMOS transistor P3 may be connected to the power supply voltage and a drain of the NMOS transistor N3, respectively. A source and gate of the NMOS transistor N3 may be connected the ground and output of the NOR gate G1 of the set pulse input circuit 141, respectively.

The inverter IN2 may receive the normal data NDAT and an output of the inverter IN2 may be connected to an input of the NAND gate G2. The inverter IV3 may receive the output of the NAND gate G2 and an output of the inverter IV3 may be connected to the node ND1. The set pulse P_SET may be received at the other input of the NAND gate G2 and an input of the NOR gate G1. The inverter IN1 may receive the write enable signal nWe and an output of the inverter IN1 may be connected to the other input of the NOR gate G1.

If a write enable signal nWE goes to a low level, the NMOS transistor N3 may be turned off. The write driver 140 may provide the step set current I_SET to a data line DL based on the normal data NDAT and the set pulse P_SET. If the normal data NDAT is '0' and the set pulse P_SET has a high level, a first node ND1 may be a high level. In a case where the first node ND1 goes to a high level, the NMOS transistor N1 may be turned on and the PMOS transistor P2 may be turned off. A voltage level of a second node ND2 may be variably determined based on the magnitude and width of the DCBL voltage. The magnitude and width of the set current I_SET flowing via the PMOS transistor P3 may be variably determined based on a voltage level of the second node ND2.

A set program time of the step set current I_SET may be variably determined according to a pulse width of the set pulse P_SET. The magnitude and width of the step set current I_SET may be variably determined according to the magnitude and width of the DCBL voltage. For example, the write driver 140 may be configured to adjust the step magnitude and width of the step set current I_SET according to the set pulse P_SET and the voltage DCBL.

Figure 6:
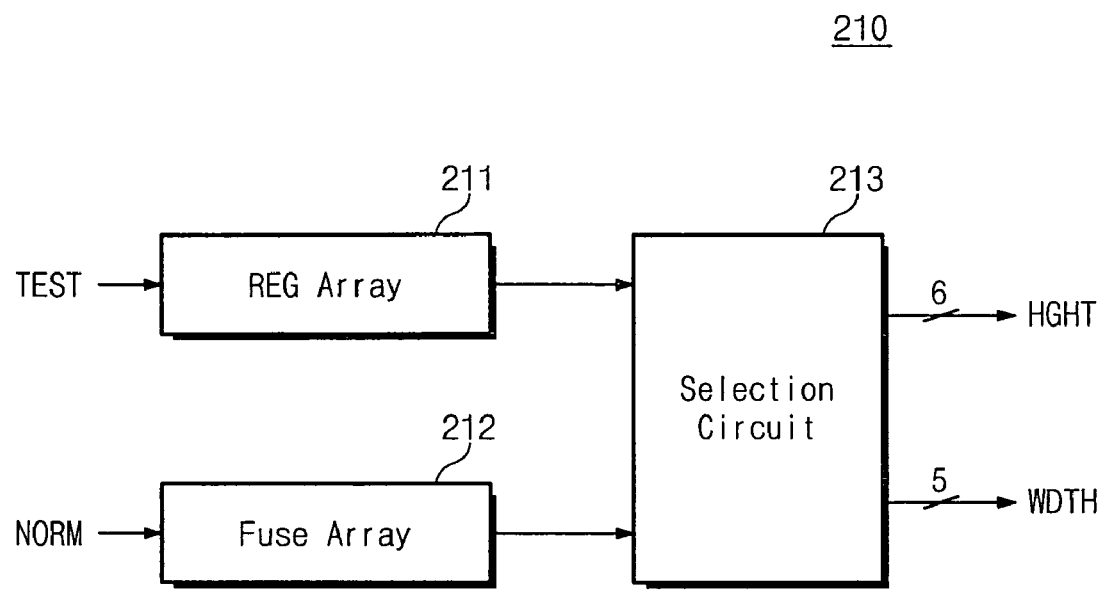
FIG. 6 is a block diagram showing a storage illustrated in FIG. 4.

FIG. 6 is a block diagram showing a storage illustrated in FIG. 4.

Referring to FIG. 6, the storage 210 may include a register array 211, a fuse array 212, and/or a selection circuit 213. The register array 211 may store step information temporarily during a test operation. A phase change memory device (e.g., refer to FIG. 4, 100) may be configured to store improved step information while changing step information in the register array 211 during the test operation.

The fuse array 212 may store the improved step information stored in the register array 211 during the test operation. The step information in the fuse array 212 may be provided to the step control circuit 300 in FIG. 4 during a normal operation. The selection circuit 213 may provide to the step control circuit 300 the step magnitude data HGHT and step width data WDTH stored in one of the register array 211 and the fuse array 212.

Figure 7:
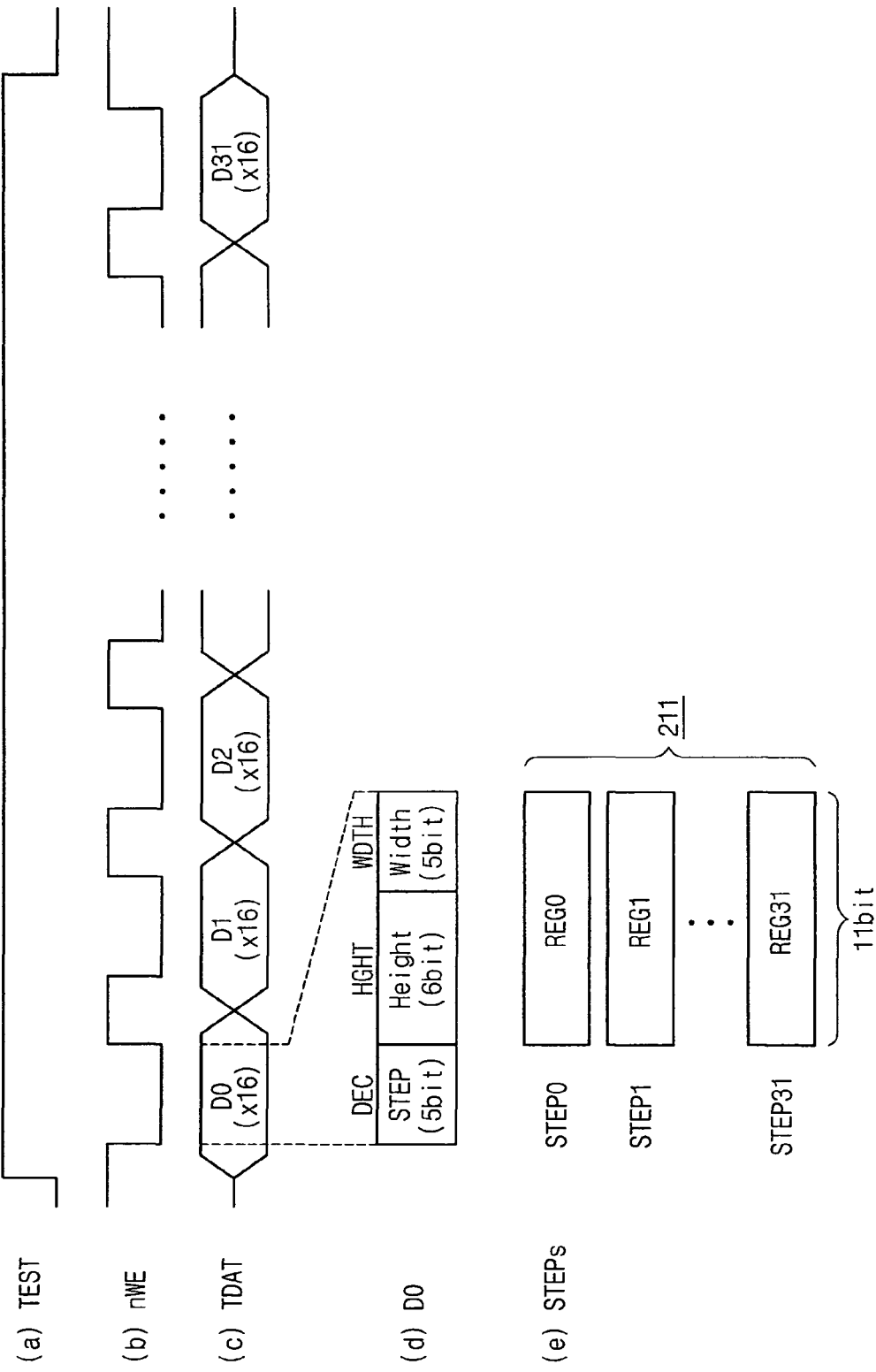
FIG. 7 is an example timing diagram for describing a test operation of a phase change memory device illustrated in FIG. 4.

FIG. 7 is an example timing diagram for describing a test operation of a phase change memory device illustrated in FIG. 4. In FIG. 7, (a) indicates a test mode signal TEST, (b) indicates a write enable signal nWE, (c) indicates test data TDAT, (d) indicates a configuration of data D0, and (e) indicates a method of storing step information.

If the test mode signal TEST is activated, the test data TDAT may be received in synchronization with a transition of the write enable signal nWE. Data D0 may include step information that is to be stored in a register REG0, and data D1 may include step information that is to be stored in a register REG1. Respective data D0 to D31 may have the same configuration. In FIG. 7, (d) shows an example configuration of data D0.

Referring to FIG. 7 data D0, as shown by (d), may include 5-bit decode data DEC, 6-bit step magnitude data HGHT, and 5-bit step width data WDTH. The 5-bit decode data DEC may be to select a register (e.g., REG0) corresponding to each (e.g., STEP0) of the steps. The 6-bit step magnitude data HGHT and the 5-bit step width data WDTH may be stored in a selected register (e.g., REG0). Accordingly, 11-bit step information in data D31 may be stored in a register REG31.

Figure 8:
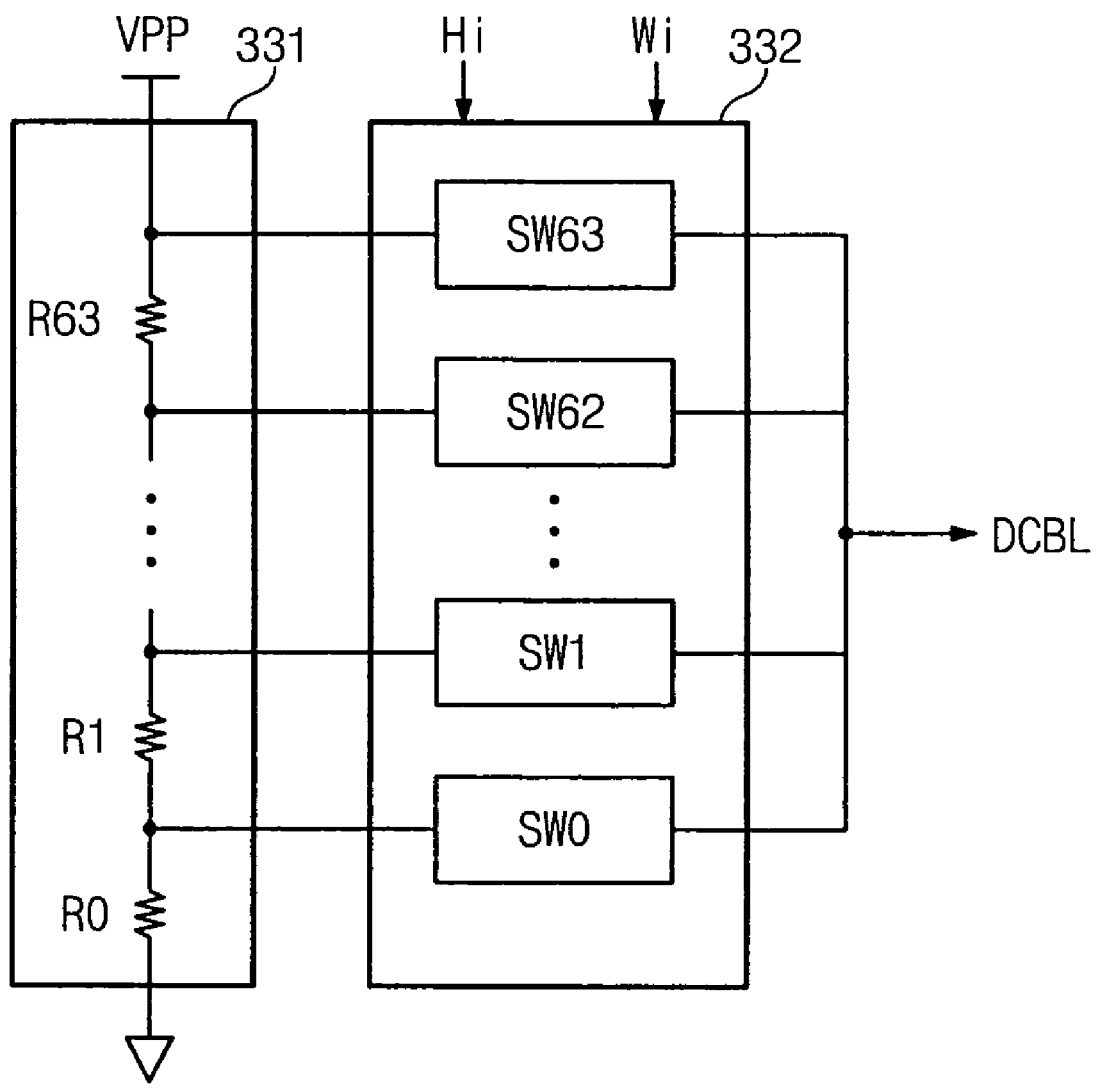
FIG. 8 is a schematic block diagram showing a DCBL driver illustrated in FIG. 4.

FIG. 8 is a block diagram showing a DCBL driver illustrated in FIG. 4.

Referring to FIG. 8, the DCBL driver 330 may include a voltage dividing part 331 and/or a switch part 332. The voltage dividing part 331 may be connected between a power terminal VPP and a ground terminal and include a plurality of resistors R0 to R63. A divided voltage may be generated from each resistor node connected between the resistors and/or the power terminal VPP. The switch part 332 may be connected to respective resistor nodes and include a plurality of switches SW0 to SW63. The switch part 332 may receive the step magnitude control signals Hi and the step width control signals Wi.

For example, assume that step magnitude data HGHT stored in a register REG0 is '111111' (63) and that step width data WDTH is '11111' (31). The switch part 332 may select a switch SW63 according to the step magnitude HGHT. The switch SW63 may be turned on during a time corresponding to W31 according to the step width data WDTH. The magnitude and width of each step may be determined according to an operation of the switch part 332, which will be more fully described with reference to FIGS. 9 to 12.

FIG. 9 is an example graph showing a step set current generating method of a phase change memory device according to an example embodiment illustrated in FIG. 4. FIG. 9 shows that a waveform of a step set current may be changed by adjusting step magnitude and width. For example, a step set current corresponding to H63 and W31 may be generated in STEP0. A step set current corresponding to HS0 and W15 may be generated in STEP1, and/or a step set current corresponding to H58 and W20 may be generated in STEP2. A step set current corresponding to H05 and W30 may be generated in STEP31. As set forth above, step information in STEP0 to STEP31 may be stored in REG0 to REG31, respectively.

Figure 10:
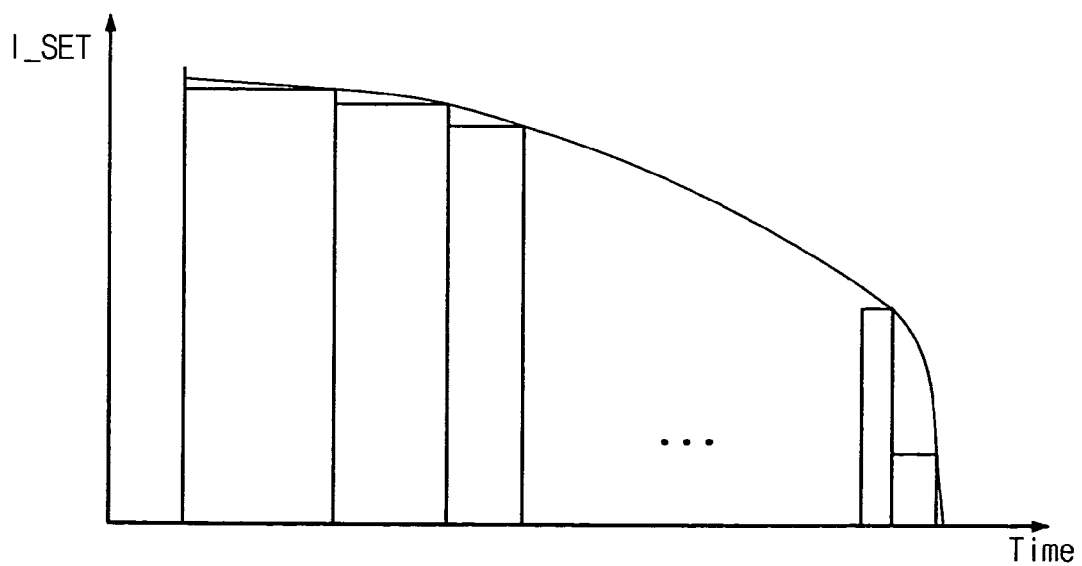
FIGS. 10 to 12 are example graphs showing various waveforms of a step set current of a phase change memory device according to an example embodiment.
Figure 11:
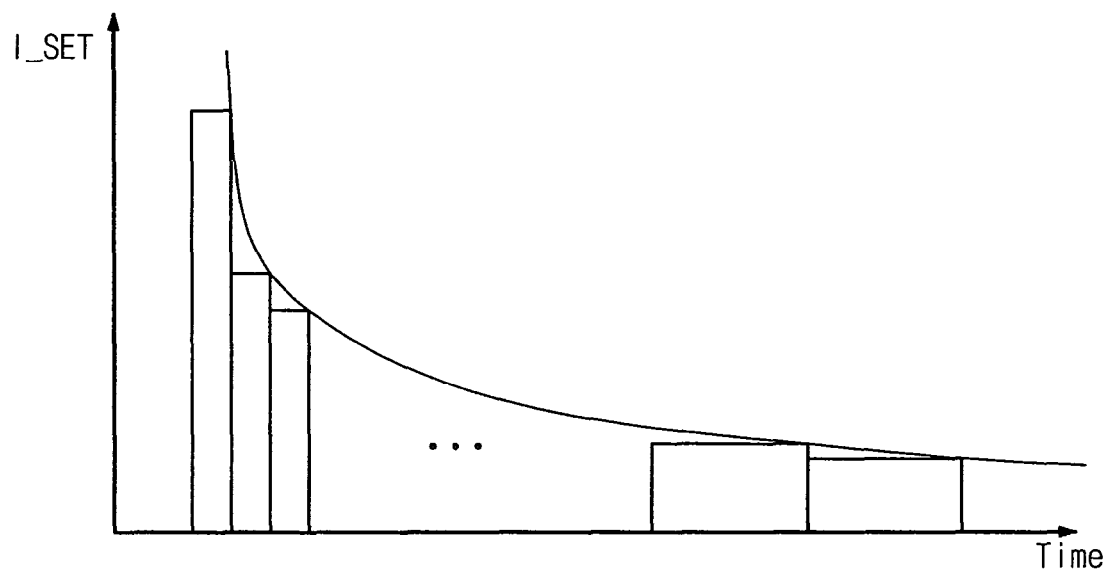
Figure 12:
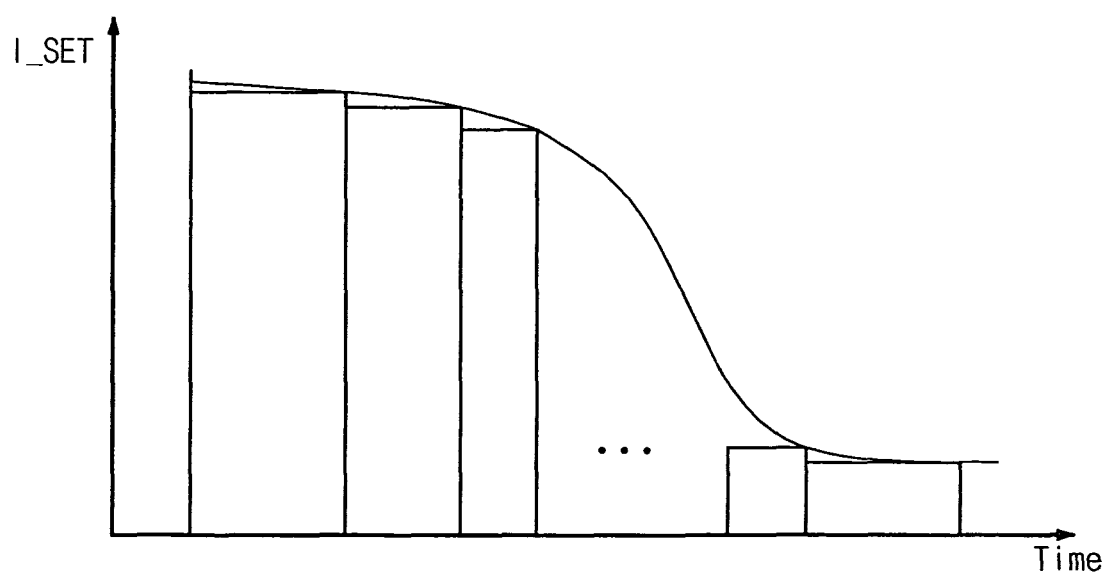

FIGS. 10 to 12 show example waveforms of a step set current of a phase change memory device according to example embodiments. In FIG. 10, a step set current I_SET has an upward convex waveform. In FIG. 11, a step set current I_SET has a downward concave waveform. In FIG. 12, a step set current I_SET has an S-lined waveform.

Accordingly, a phase change memory device according to example embodiments may adjust the magnitude and width of each step of a step set current. Therefore, a waveform of the step set current may be changed. Accordingly, a set resistance distribution may be narrowed and/or sensing margin may be improved through generation of an improved step set current.

Although example embodiments have been shown and described in this specification and figures, it would be appreciated by those skilled in the art that changes may be made to the illustrated and/or described example embodiments without departing from their principles and spirit.

What is claimed is:

1. A phase change memory device comprising:
   a memory cell array including a plurality of memory cells;
   a write driver configured to provide a program current to the memory cell array for setting a state of a phase change material to program a selected memory cell, the write driver configured to provide the program current such that the program current has a plurality of steps; and
   a control unit configured to receive step information for adjusting a magnitude and a width of each step of the program current during a test operation and provide the step information to the write driver during a normal operation.

2. The phase change memory device of claim 1, wherein the write driver is configured to adjust each step of the program current based on the step information and provide each step of the adjusted program current to the memory cell array in response to a program pulse corresponding to each step of the program current received from the control unit.

3. The phase change memory device of claim 1, further comprising:
   a data buffer configured to receive external data and provide the external data to the write driver during the normal operation.

4. The phase change memory device of claim 3, wherein the control unit is configured to receive the step information via the data buffer.

5. The phase change memory device of claim 4, wherein the step information includes data for adjusting the magnitude of each step, data for adjusting the width of each step, and data for associating the magnitude data and the width data to a corresponding step.

6. The phase change memory device of claim 1, wherein the control unit includes a register array for storing the step information.

7. The phase change memory device of claim 6, wherein the control unit includes a fuse array, the step information being stored in the fuse array during the normal operation.

8. The phase change memory device of claim 7, wherein the register array is activated during the test operation and the fuse array is activated during the normal operation.

9. The phase change memory device of claim 1, wherein each of the plurality of memory cells comprises:
   a memory element including the phase change material; and
   a select element configured to select a corresponding memory cell.

10. The phase change memory device of claim 9, wherein the select element is a diode.

11. The phase change memory device of claim 1, wherein the test operation or the normal operation is controlled by a mode register set.

12. The phase change memory device of claim 1, wherein the test operation is carried out in a chip fabrication level.

13. The phase change memory device of claim 1, wherein the write driver is configured to provide the program current to the memory array for setting the state of the phase change material to an amorphous state.

14. The phase change memory device of claim 1, wherein the write driver is configured to provide the program current to the memory array for setting the state of the phase change material to a crystalline state.

15. The phase change memory device of claim 13, wherein the write driver is configured to provide the program current to the memory array for setting the state of the phase change material to an amorphous state.

16. The phase change memory device of claim 13, wherein the write driver is configured to provide the program current to the memory array for setting the state of the phase change material to a crystalline state.

* * * * *